(12) United States Patent
Dimitrakopoulos et al.

(10) Patent No.: US 6,344,662 B1
(45) Date of Patent: Feb. 5, 2002

(54) THIN-FILM FIELD-EFFECT TRANSISTOR WITH ORGANIC-INORGANIC HYBRID SEMICONDUCTOR REQUIRING LOW OPERATING VOLTAGES

(75) Inventors: Christos Dimitrios Dimitrakopoulos, West Harrison; Cherie Renee Kagan, Ossining; David Brian Mitzi, Mahopac, all of NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/703,964

(22) Filed: Nov. 1, 2000

Related U.S. Application Data

(63) Continuation-in-part of application No. 09/323,804, filed on Jun. 2, 1999, which is a continuation of application No. 08/827,018, filed on Mar. 25, 1997, now Pat. No. 5,981,970, which is a continuation-in-part of application No. 09/259,128, filed on Feb. 26, 1999, now Pat. No. 6,210,479.

(51) Int. Cl.[7] .............................................. H01L 35/24
(52) U.S. Cl. ........................ 257/40; 257/289; 257/310
(58) Field of Search ........................ 257/40, 76, 289, 257/295, 310, 347, 410

(56) References Cited

U.S. PATENT DOCUMENTS 6,180,956 B1 * 1/2001 Chondroudis et al. ........ 257/40

OTHER PUBLICATIONS

Kagan, C.R., et al., "Organic–Inorganic Hyabrid Materials as Semiconducting Channels in Thin–Film Field–Effect Transistors," Science, vol. 286, No. 5441, Oct. 29, 1999, pp. 945–947.*

* cited by examiner

Primary Examiner—Sara Crane
(74) Attorney, Agent, or Firm—Daniel P. Morris

(57) ABSTRACT

A thin film transistor (TFT) device structure based on an organic-inorganic hybrid semiconductor material, that exhibits a high field effect mobility, high current modulation at lower operating voltages than the current state of the art organic-inorganic hybrid TFT devices. The structure comprises a suitable substrate disposed with the following sequence of features: a set of conducting gate electrodes covered with a high dielectric constant insulator, a layer of the organic-inorganic hybrid semiconductor, sets of electrically conducting source and drain electrodes corresponding to each of the gate lines, and an optional passivation layer that can overcoat and protect the device structure. Use of high dielectric constant gate insulators exploits the gate voltage dependence of the organic-inorganic hybrid semiconductor to achieve high field effect mobility levels at very low operating voltages. Judicious combinations of the choice of this high dielectric constant gate insulator material and the means to integrate it into the organic-inorganic hybrid based TFT structure are taught that would enable easy fabrication on glass or plastic substrates and the use of such devices in flat panel display applications.

42 Claims, 9 Drawing Sheets

Fig. 2A (left ordinate)
Fig. 2B (right ordinate)

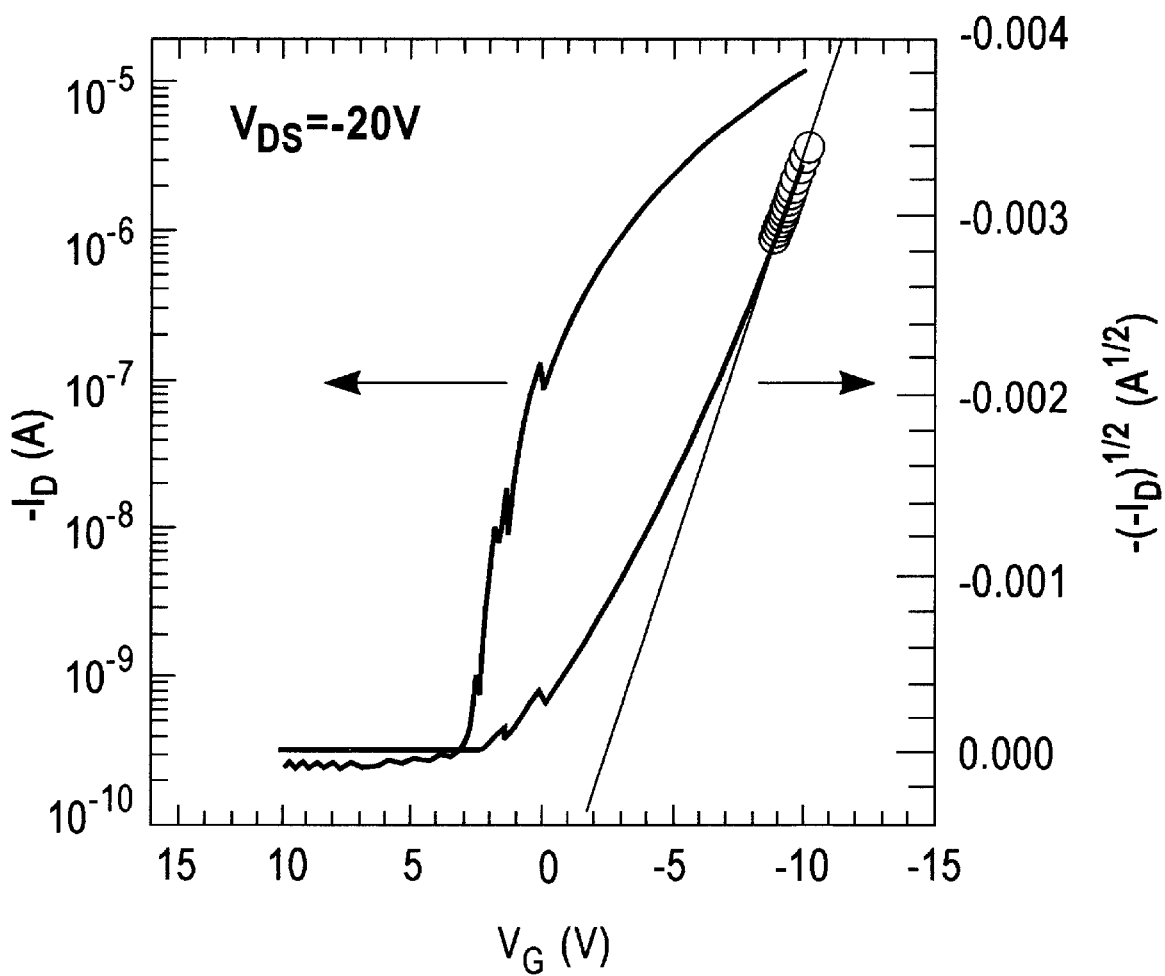
Fig. 5A (left ordinate)
Fig. 5B (right ordinate)

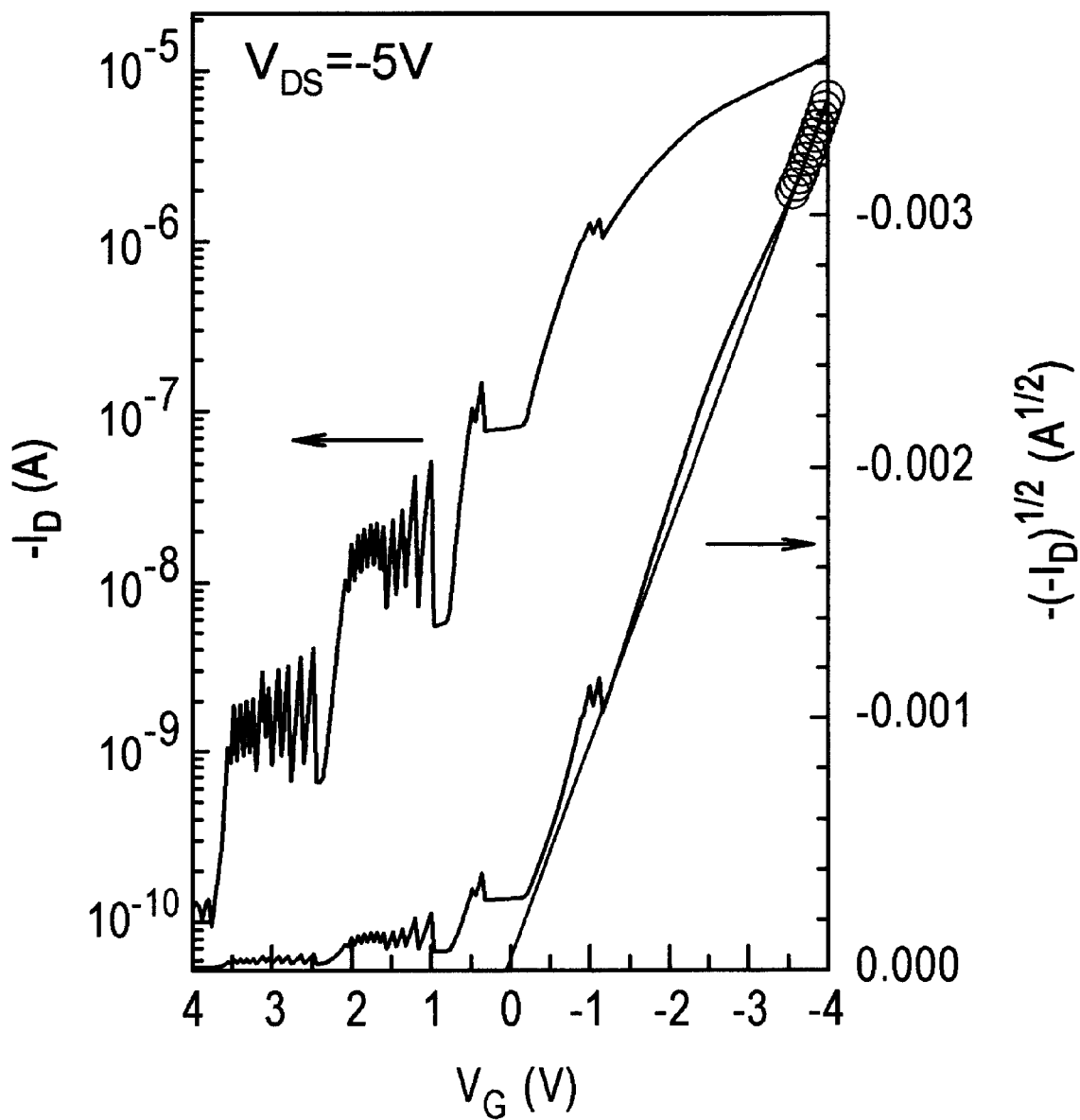
Fig. 7A (left ordinate)
Fig. 7B (right ordinate)

THIN-FILM FIELD-EFFECT TRANSISTOR WITH ORGANIC-INORGANIC HYBRID SEMICONDUCTOR REQUIRING LOW OPERATING VOLTAGES

This is a continuation-in-part of U.S. application Ser. No. 09/323,804, filed on Jun. 2, 1999, entitled "Thin-Film Field-Effect Transistor With Organic Semiconductor Requiring Low Operating Voltages", which is a continuation of U.S. application Ser. No. 08/827,018, filed on Mar. 25, 1997, now issued as U.S. Pat. No. 5,981,970, issued Nov. 9, 1999, the teaching of which is incorporated herein by reference.

This is a continuation-in-part of U.S. application Ser. No. 09/259,128, filed on Feb. 26, 1999, entitled "Product And Process For Forming A Semiconductor Structure On A Host Substrate", U.S. Pat. No. 6,210,479, the teaching of which is incorporated herein by reference.

Notwithstanding the specific mechanism of how the characteristics are achieved, we claim that we have demonstrated a structure and a process to fabricate the same to achieve high field effect mobilities and high current modulation in organic-inorganic hybrid perovskite-based TFTs. While the present invention has been described with respect to preferred embodiments, numerous modifications, changes, and improvements will occur to those skilled in the art without departing from the spirit and scope of the invention. All references cited herein are incorporated herein by reference and all references cited by the reference cited herein are incorporated herein by reference.

FIELD OF THE INVENTION

This invention pertains to the field of organic-inorganic hybrid materials as the semiconducting channels in thin film field effect transistors (TFT), and in particular to the low-voltage operation of such transistors, using high dielectric gate insulators, in applications such as flat panel displays.

BACKGROUND

Thin film field effect transistors (TFT) used in liquid crystal display (LCD) and other flat panel applications typically use amorphous silicon (a-Si:H) or polycrystalline silicon as the semiconductor and silicon dioxide and/or silicon nitride as the gate insulator. Recent developments in materials have led to the exploration of organic oligomers such as hexathiophene and its derivatives, and organic molecules such as pentacene (G. Horowitz, D. Fichou, X. Peng, Z. Xu, F. Garnier, *Solid State Commun.* Volume 72, pg. 381, 1989; F. Garnier, G. Horowitz, D. Fichou, U.S. Pat. No. 5,347,144) as potential low-cost and/or low-temperature replacements for amorphous silicon as the semiconductor in thin-film field-effect transistors. Field effect mobility in the range of 1 cm$^2$ V$^{-1}$ sec$^{-1}$ has been achieved in pentacene based TFT's with SiO$_2$ as the gate insulator (Y. Y. Lin, D. J. Gundlach, S. F. Nelson, T. N. Jackson, *IEEE Electron Device Lett.* Vol. 18 pp. 606–608 1997), making them potential candidates for such applications. A major drawback of these pentacene-based organic TFTs is the high operating voltage that is required to achieve high current modulation and simultaneously produce high current modulation (typically about 100 V when 0.4 µm thick SiO$_2$ gate insulator is used). Reducing the thickness of the gate insulator would improve the above mentioned characteristics but there is a limit to the decrease of the insulator thickness, which is imposed by manufacturing difficulties and reliability issues. For example in the current generation of TFT LCD devices the thickness of the TFT gate insulator is typically 0.3 to 0.4 µm. Recently, it was shown that high mobility can be achieved in pentacene devices comprising a high dielectric constant ($\in$) gate insulator, at lower voltages than pentacene TFTs using a comparable thickness of SiO$_2$ (C. D. Dimitrakopoulos, P. R. Duncombe, B. K. Furman, R. B. Laibowitz, D. A. Neumayer, S. Purushothaman, U.S. Pat. No. 5,981,970 and 5,946,551, C. D. Dimitrakopoulos, S. Purushothaman, J. Kymissis, A. Callegari, J. M. Shaw, *Science*, 283, 822–824, (1999); C. D. Dimitrakopoulos, J. Kymissis, S. Purushothaman, D. A. Neumayer, P. R. Duncombe, R. B. Laibowitz, *Advanced Materials*, Vol. 11, 1372–1375, (1999)).

Recently a new class of TFT was demonstrated, one that comprised an organic-inorganic hybrid material as the semiconductor such as the organic-inorganic perovskite $(C_6H_5C_2H_4NH_3)_2SnI_4$. This class of organic-inorganic hybrid materials can be defined as "molecular scale composites" (K. Chondroudis, C. D. Dimitrakopoulos, C. R. Kagan, I. Kymissis, D. B. Mitzi; "Thin Film Field Effect Transistors With Organic-Inorganic Hybrid Materials As Semiconducting Channels"; Ser. No. 09/245,460; Filed on Feb. 5, 1999; "Organic-Inorganic Hybrid Materials as Semiconducting Channels in Thin-Film Field-Effect Transistors", C. R. Kagan, D. B. Mitzi, C. D. Dimitrakopoulos, *Science* Vol. 286, 945–947, (1999).). These transistors have problems similar to the ones described above for pentacene: high operating voltage is required to achieve high mobility and simultaneously produce high current modulation (typically about 60 V when 0.5 µm thick SiO$_2$ insulator is used). Reducing the thickness of the gate insulator lowers the required operating voltages to achieve the above mentioned characteristics. Again there is a limitation to the decrease in insulator thickness, which is imposed by manufacturing constraints and reliability issues, especially for large area applications such as flat panel displays, where the gate insulator is not thermally grown on Si single crystals but is deposited on top of a gate electrode. Using a high dielectric constant gate insulator to achieve high mobility at lower voltages, as was shown in organic TFTs, is not an obvious solution since such an insulator should not be expected to have an effect on the mobility measured from a crystalline inorganic semiconductor, where mobility is considered a constant parameter. In the organic-inorganic perovskite $(C_6H_5C_2H_4NH_3)_2SnI_4)$ conduction takes place in the inorganic component and the organic component is insulating (D. B. Mitzi, C. A. Feild, W. T. A. Harrison, A. M. Guloy, *Nature*, Vol. 369, 467–469 (1994); K. Chondroudis, C. D. Dimitrakopoulos, C. R. Kagan, I. Kymissis, D. B. Mitzi; "Thin Film Field Effect Transistors With Organic-Inorganic Hybrid Materials As Semiconducting Channels"; Ser. No. 09/245,460, Filed on Feb. 5, 1999). While this is true for $C_6H_5C_2H_4NH_3)_2SnI_4$, other hybrid materials can be designed in which the organic part consists of conjugated organic molecules, such as an oligothiophene containing molecule for example, and the inorganic part is insulating and is used to template the organization of the conjugated organic molecules, thus increasing their conductivity and/or mobility.

The electrical characteristics of TFTs having the organic-inorganic hybrid perovskite $(C_6H_5C_2H_4NH_3)_2SnI_4$ as the semiconductor, a heavily doped Si-wafer as the gate electrode, 500 nm thick thermally grown SiO$_2$ as gate insulator, and Pd source and drain electrodes, are adequately modeled by standard field effect transistor equations (S. M. Sze "*Physics of Semiconductor Devices*", Wiley, New York, 1981, pg. 442), as shown previously (K. Chondroudis, C. D. Dimitrakopoulos, C. R. Kagan, I. Kymissis, D. B. Mitzi;

"Thin Film Field Effect Transistors With Organic-Inorganic Hybrid Materials As Semiconducting Channels"; Ser. No. 09/245,460; Filed on Feb. 5, 1999; "Organic-Inorganic Hybrid Materials as Semiconducting Channels in Thin-Film Field-Effect Transistors", C. R. Kagan, D. B. Mitzi, C. D. Dimitrakopoulos, *Science* Vol. 286, 945–947, (1999)). The organic-inorganic perovskite $(C_6H_5C_2H_4NH_3)_2SnI_4$ used in these devices behaves as a p-type semiconductor. FIG. 1, cited from "Organic-Inorganic Hybrid Materials as Semiconducting Channels in Thin-Film Field-Effect Transistors", C. R. Kagan, D. B. Mitzi, C. D. Dimitrakopoulos, *Science* Vol. 286, 945–947, (1999)), shows the dependence of the current flowing between the source and drain electrodes ($I_D$) on the voltage applied to the drain electrode ($V_D$), at discrete voltages applied to the gate electrode ($V_G$). When the gate electrode is biased negatively with respect to the grounded source electrode, $(C_6H_5C_2H_4NH_3)_2SnI_4$-based TFTs operate in the accumulation mode and the accumulated carriers are holes. At low $V_D$, $I_D$ increases linearly with $V_D$ (linear region) and is approximately given by the equation:

$$I_D = \frac{WC_i}{L} \mu \left(V_G - V_T - \frac{V_D}{2}\right) V_D \quad (1)$$

where L is the channel length, W is the channel width, $C_i$ is the capacitance per unit area of the insulating layer, $V_T$ is a threshold voltage, and $\mu$ is the field effect mobility. $\mu$ can be calculated in the linear region from the transconductance:

$$g_m = \left(\frac{\partial I_D}{\partial V_G}\right)_{V_D=const} = \frac{WC_i}{L} \mu V_D, \quad (2)$$

by plotting $I_D$ vs. $V_G$ at a constant low $V_D$ and equating the value of the slope of this plot to $g_m$.

When the drain electrode is more negatively biased than the gate electrode (i.e. $-V_D \geq -V_G$), with the source electrode being grounded (i.e. $V_S=0$), the current flowing between source and drain electrodes ($I_D$) saturates (does not increase any further) due to the pinch-off in the accumulation layer (saturation region), and is modeled by the equation:

$$I_D = \frac{WC_i}{2L} \mu (V_G - V_T)^2.$$

FIG. 2*a* shows the dependence of $I_D$ on $V_G$ in saturation in a semilogarithmic scale (C. R. Kagan, D. B. Mitzi, C. D. Dimitrakopoulos, *Science*, volume 286, 945–947, (1999)). The field effect mobility can be calculated from the slope of the $\sqrt{|I_D|}$ vs. $V_G$ plot. FIG. 2*b* shows a plot of the square root of $I_D$ vs $V_G$. A mobility of 0.55 cm$^2$ V$^{-1}$ sec$^{-1}$ is calculated from this plot.

The present invention demonstrates TFT structures that overcome the need to use high operating voltages in order to achieve the desirable combination of high field effect mobility and high current modulation, without having to reduce the thickness of the insulator. Such structures contain an inorganic high dielectric constant gate insulator layer (for example, barium zirconate titanate) in combination with an organic-inorganic hybrid material as the semiconductor (for example, the organic-inorganic perovskite $(C_6H_5C_2H_4NH_3)_2SnI_4$).

The present invention provides methods to produce organic-inorganic hybrid TFT structures wherein the high dielectric constant gate insulator is deposited and processed at temperatures compatible with glass (below 400° C.), plastic substrates in general (below 400° C.), and transparent plastic substrates (below 150° C.) which are substantially lower than the processing temperatures of these materials when they are used for memory applications (up to 650° C). An advantage of this invention are methods to produce organic-inorganic hybrid TFT structures wherein the high dielectric constant gate insulator and all the other materials are deposited and processed at temperatures below 100° C.

SUMMARY OF THE INVENTION

A broad aspect of the claimed invention is a transistor device structure comprising: a substrate on which an electrically conducting gate electrode is disposed; a layer of gate insulator disposed on the gate electrode; an electrically conductive source electrode and an electrically conductive drain electrode disposed on the high layer of gate insulator; and, a layer of an organic-inorganic hybrid semiconductor disposed on said gate insulator and said source electrode and said drain electrode.

Another broad aspect of the invention is a transistor device structure comprising: a drain a source electrode, a drain electrode, a gate electrode, a gate insulator and a semiconductive material disposed between and in electrical contact with said source electrode and said gate electrode, said gate insulator is disposed between said gate electrode and said active region, said semiconductive material is an organic-inorganic hybrid material.

BRIEF DESCRIPTION OF THE DRAWINGS

FIG. 5*a* shows the dependence of the drain current on the gate voltage at a fixed source-drain voltage in a semilogarithmic scale for the TFT device corresponding to FIG. 4.

FIG. 5*b* (right axis) is a linear scale plot of the square root of the drain current from FIG. 5*a* as a function of the gate voltage in the saturation regime. It is used to calculate the field effect mobility, as described previously.

FIG. 7a (left axis) is the measured operating characteristics of a TFT device using the organic-inorganic hybrid perovskite $(C_6H_5C_2H_4NH_3)_2SnI_4$ as semiconductor and an approximately 177.5 nm thick layer of barium zirconate titanate film (deposited by sputtering keeping the substrate at room temperature) as the gate insulator. Dependence of the drain current on the gate voltage at a fixed source-drain voltage is shown in a semilogarithmic scale.

FIG. 7b (right axis) is a plot of the square root of the drain current from FIG. 5a as a function of the gate voltage in the saturation regime used to calculate the field effect mobility.

DETAILED DESCRIPTION

Figure 1:
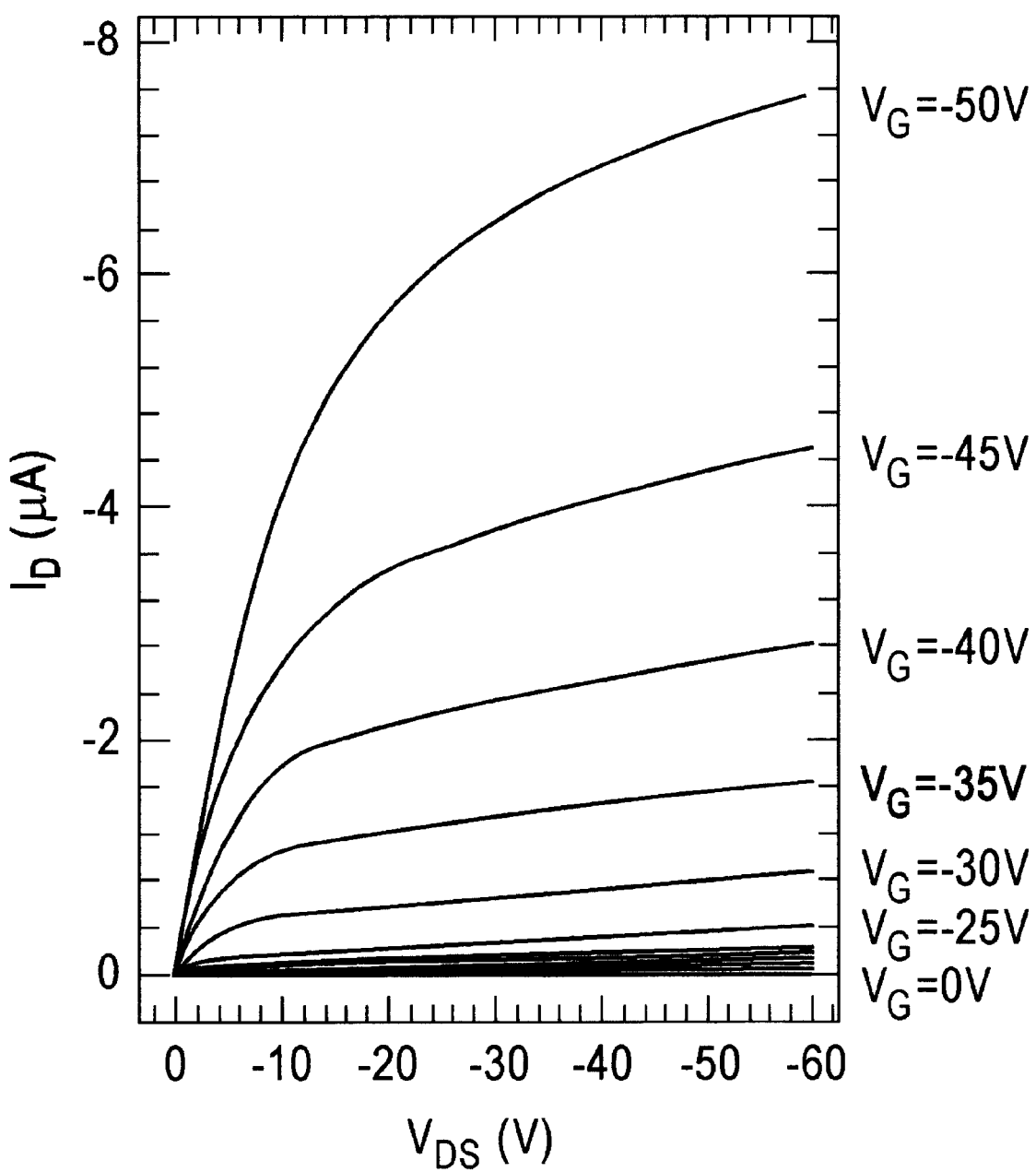
FIG. 1 is the measured operating characteristics of a TFT device using the organic-inorganic hybrid perovskite $(C_6H_5C_2H_4NH_3)_2SnI_4$ as semiconductor with SiO$_2$ gate insulator having a thickness of 500 nm. Dependence of drain current as a function of source-drain voltage is shown for different discrete values of the gate voltage (cited from Kagan, Mitzi and Dimitrakopoulos, Science, Vol. 286, pp. 945–947, (1999)). In this device, L=28 $\mu$m and W=1000 $\mu$m.

The proposed TFT structures make use of a high dielectric constant thin film gate insulator, an organic-inorganic hybrid semiconductor such as the organic-inorganic perovskite $(C_6H_5C_2H_4NH_3)_2SnI_4$, and a metal, conducting polymer, highly doped high conductivity material or a combination thereof as the gate, source, and drain electrodes.

There are many candidate materials with high dielectric constant that can be used as gate insulator layers in the above structures, including but not restricted to $Ta_2O_5$, $Y_2O_3$, $TiO_2$, $Al_2O_3$, $Si_3N_4$, and the family of ferroelectric insulators, including but not restricted to $PbZ_xTi_{1-x}O_3$ (PZT), $Bi_4Ti_3O_{12}$, $BaMgF_4$, barium zirconate titanate (BZT) and $Ba_xSr_{1-x}TiO_3$ (BST). These materials have been studied and used in the past in combination with inorganic semiconductors mainly for memory device applications (P. Balk, *Advanced Materials,* Volume 7, pg. 703, 1995 and references therein) and in combination with organic semiconductors (Dimitrakopoulos et al. U.S. Pat. Nos. 5,981,970 and 5,946,551) but never in combination with organic-inorganic hybrid semiconductors for electronic device applications. Typically these insulators are annealed at 600° C. or higher to achieve dielectric constant ($\in$) values exceeding 150, in the case of inorganic semiconductors. In the case of organic semiconductors processing temperatures are typically kept below 400° C. The high dielectric constant ($\in$) gate insulator could be a composite material comprising very high dielectric constant inorganic particles embedded in a polymer matrix (S. Liang, S. R. Chong. E. P. Giannelis, "Electronic Components and Technology Conference", IEEE, 1998, pp. 171–175). This class of dielectrics will be referred to as composite dielectrics herein.

In general the proposed structure uses an inorganic, high dielectric constant gate insulator in combination with a semiconducting organic-inorganic hybrid material (e.g. the organic-inorganic perovskite $(C_6H_5C_2H_4NH_3)_2SnI_4$) in a TFT structure. The high $\in$ insulator is deposited in vacuo by sputtering, or by another method including but not restricted to electron-beam evaporation, laser ablation, molecular beam deposition, chemical vapor deposition, or by solution processing followed by an annealing step at about 400° C., or by anodization. In all of these techniques the processing temperatures must be kept below 400° C. to make possible the use of glass substrates or plastics that can withstand high temperatures, such as polyimides for example. Several of these techniques can also be used at processing temperatures below 100° C. which makes them compatible with transparent plastic substrates, such as polycarbonate for example.

By the term high $\in$ a dielectric constant $\in$>3.9, the dielectric constant of $SiO_2$ is denoted. Consequently, in this application a high dielectric constant gate insulator is defined as an insulator with a dielectric constant $\in$>3.9. Room temperature processed, sputtered BZT has usually a dielectric constant $\in \approx 17$. High dielectric constant organic insulators with $\in$>3.9, which also fulfill other requirements, such as environmental stability, high breakdown voltage, good film-forming capability, absence of mobile charges, could also be used instead of the previously mentioned inorganic insulators for the proposed structures. High dielectric composite insulators such as barium titanate/epoxy composite dielectric materials (S. Liang, S. R. Chong. E. P. Giannelis, "Electronic Components and Technology Conference", IEEE, 1998, pp. 171–175) could also be used as gate insulators in the proposed structures.

A typical sequence used in the fabrication of the proposed TFT structures includes the following steps: preparation of the gate electrode, which can be either the substrate itself, in such case being heavily doped Si, or a patterned metal (or conducting polymer or other conductive material) gate electrode deposited and patterned on a substrate;

deposition of the high dielectric constant gate insulator on top of the gate electrode by one of various processes including but not restricted to spin coating from solution, sputtering, chemical vapor deposition (CVD), laser ablative deposition, physical vapor deposition and anodization;

optionally annealing the films at a suitable temperature, which is limited by an upper limit of 400° C., to improve the film quality and enhance the dielectric constant;

fabrication of the electrically conducting source and drain electrodes on top of gate insulator;

deposition of the organic-inorganic hybrid semiconductor (e.g. the organic-inorganic hybrid perovskite $(C_6H_5C_2H_4NH_3)_2SnI_4$) on top of the gate insulator by one of various processes including but not restricted to vapor deposition, sublimation, spin-coating from solution, dip-coating from solution or self assembly of layers from solution;

and optionally applying a passivation coating of an insulator by chemical vapor deposition (CVD), physical vapor deposition or spin coating and curing or other means.

The sequence of the steps comprising the deposition of the organic-inorganic hybrid semiconductor and the fabrication of the source and drain electrodes could be reversed to allow process compatibility and ease of fabrication.

FIG. 1, which corresponds to a device using the organic-inorganic hybrid perovskite $(C_6H_5C_2H_4NH_3)_2SnI_4$ as a spin-coated semiconducting layer, a heavily doped Si wafer as gate electrode, 500 nm thick thermally grown $SiO_2$ as gate insulator, and Pd source and drain electrodes, shows the dependence of the current flowing between source and drain electrodes ($I_D$) on the voltage applied to the drain electrode ($V_D$), at discrete voltages applied to the gate electrode ($V_G$). The linear region of the plots (i.e. at low $V_D$) can be modeled by Equation 1 as discussed previously. L=28 μm, and W=1000 μm.

Figure 2:
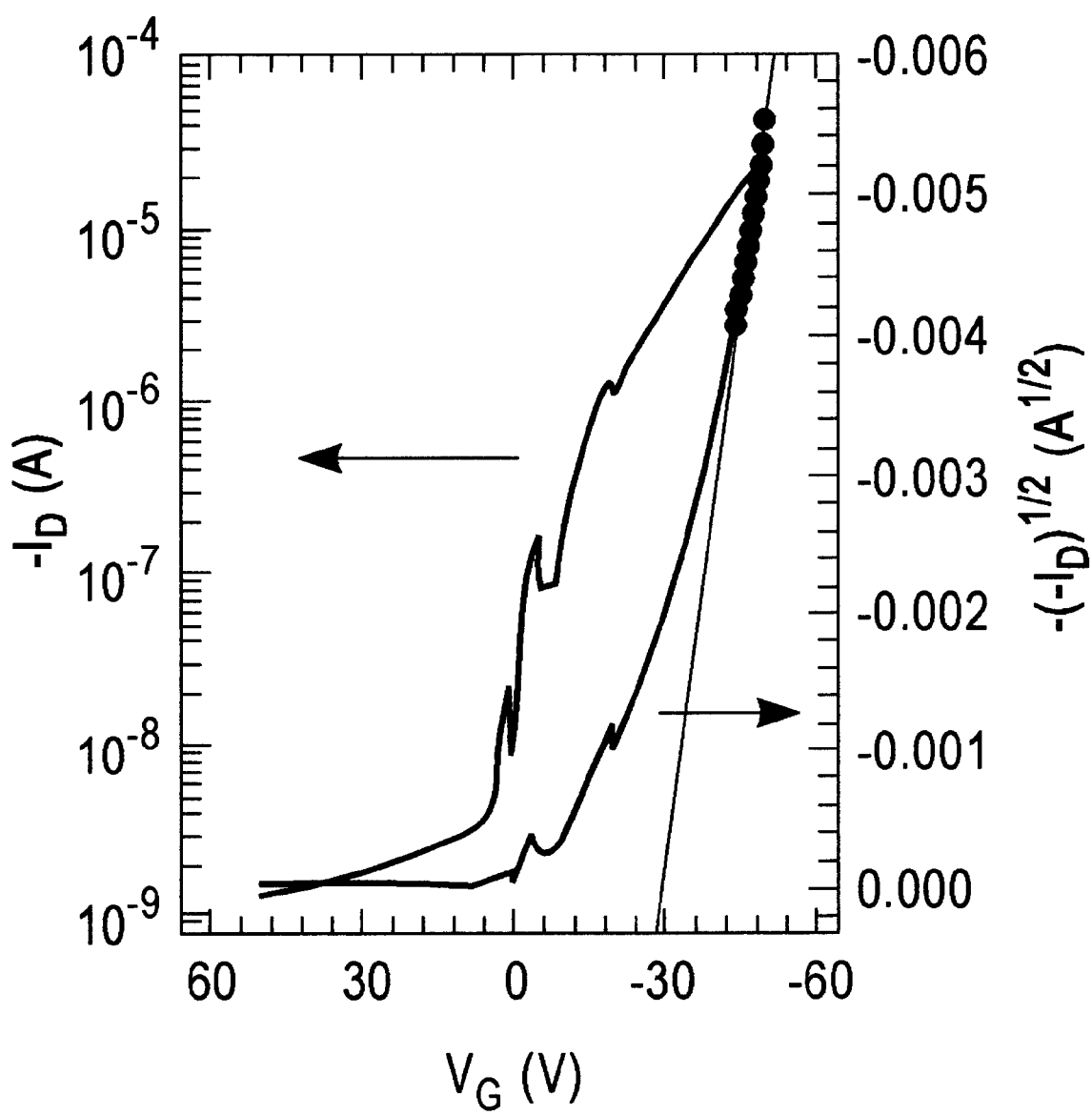
FIG. 2*a* shows the dependence of the drain current on the gate voltage at a fixed source-drain voltage in a semilogarithmic scale for the TFT device corresponding to FIG. 1.
FIG. 2*b* (right axis) is a linear scale plot of the square root of the drain current from FIG. 2*a* as a function of the gate voltage in the saturation regime. It is used to calculate the field effect mobility, as described previously.

FIG. 2a corresponds to the same device as above and show the dependence of $I_D$ on $V_G$ in the saturation region. The current modulation is about $10^4$ for a gate voltage variation from −50 to +50 volts, while keeping the drain voltage at −100 volts. By patterning the hybrid semiconductor, the current modulation increased to about $10^6$. The field effect mobility, $\mu$, was calculated from the slope of the $\sqrt{|I_D|}$ vs. $V_G$ plot (FIG. 2b) to be 0.55 cm$^2$ V$^{-1}$ sec$^{-1}$. These data are comparable to the ones for similar TFT structures described earlier as part of the prior art review. As explained earlier, although the mobility is acceptable for practical TFT applications, the operating voltage is far too high compared to the drivers used for a-Si:H TFTs, most notably in AMLCDs. The field effect mobility measured from TFT devices such as the one corresponding to FIG. 1 and FIG. 2, shows a gate voltage dependence. In particular, high mobilities are obtained at higher gate voltages. This in turn results in the need for using impractically high operating voltages in these devices to obtain acceptable mobilities. To solve this problem we have examined the dependence of the field effect mobility, $\mu$, measured from TFT devices such as the one corresponding to FIG. 1 and FIG. 2, on the applied gate voltage, $V_G$ in greater detail.

Figure 3:
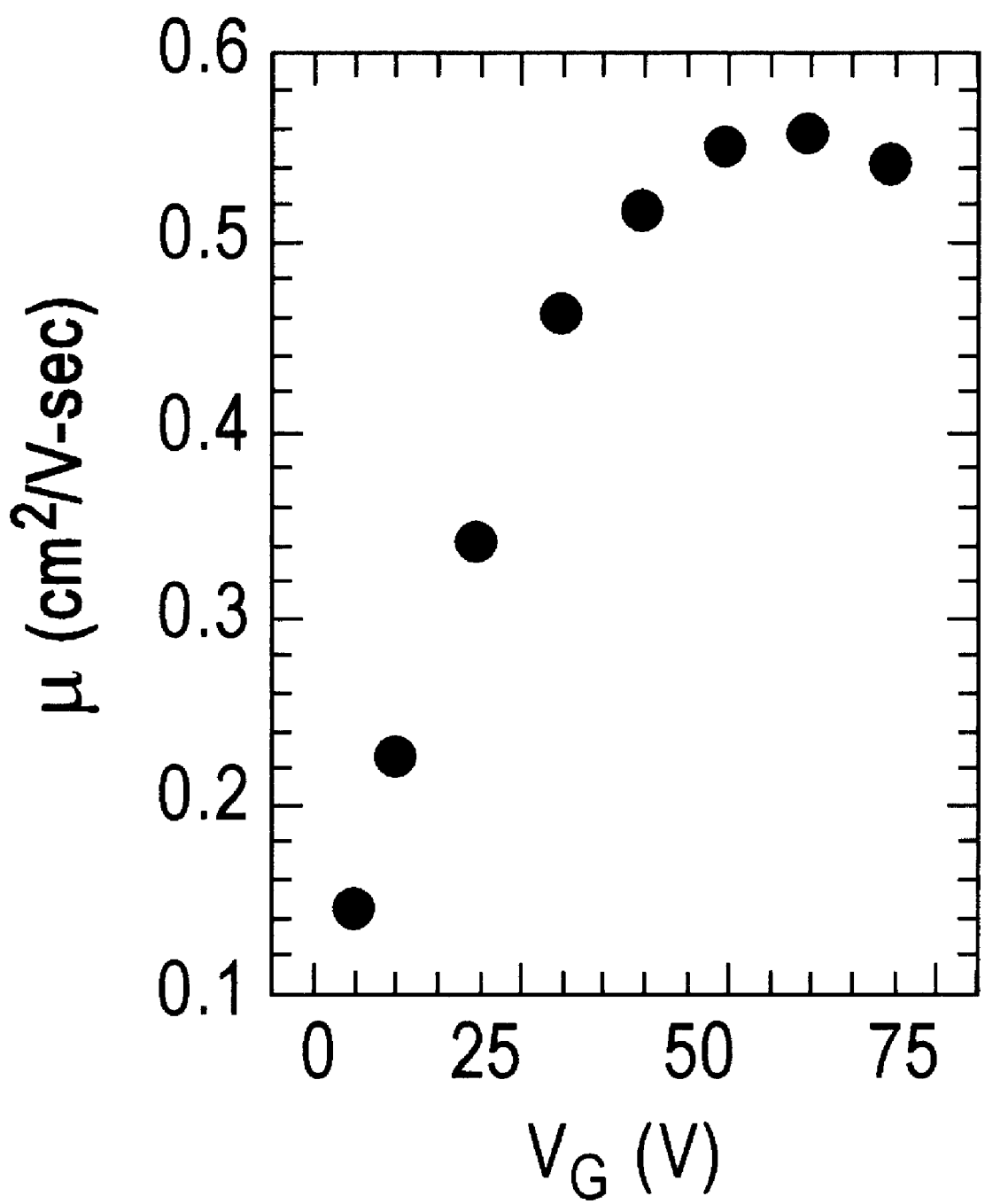
FIG. 3 is a plot of the field effect mobility calculated for the devices characterized by FIG. 2 at different gate voltages but at the same source-drain voltage (−100V), showing that there is a strong dependence of the mobility on gate voltage.
Figure 4:
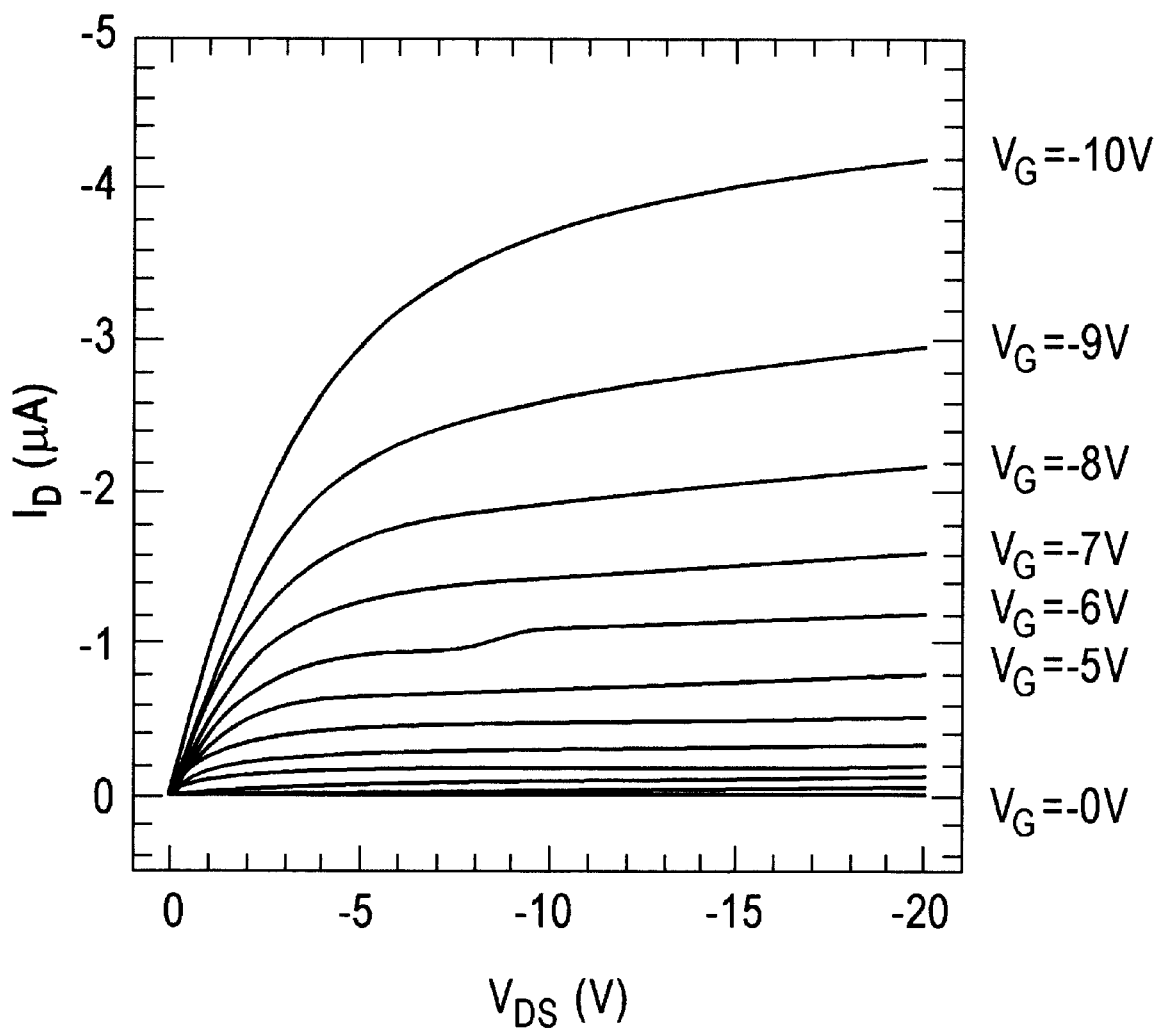
FIG. 4 is the measured operating characteristics of a TFT device using the organic-inorganic hybrid perovskite $(C_6H_5C_2H_4NH_3)_2SnI_4$ as semiconductor with SiO$_2$ gate insulator having a thickness of 150 nm. Dependence of drain current as a function of source-drain voltage is shown for different discrete values of the gate voltage. In this device, L=28 $\mu$m and W=1000 $\mu$m.
Figure 6A:
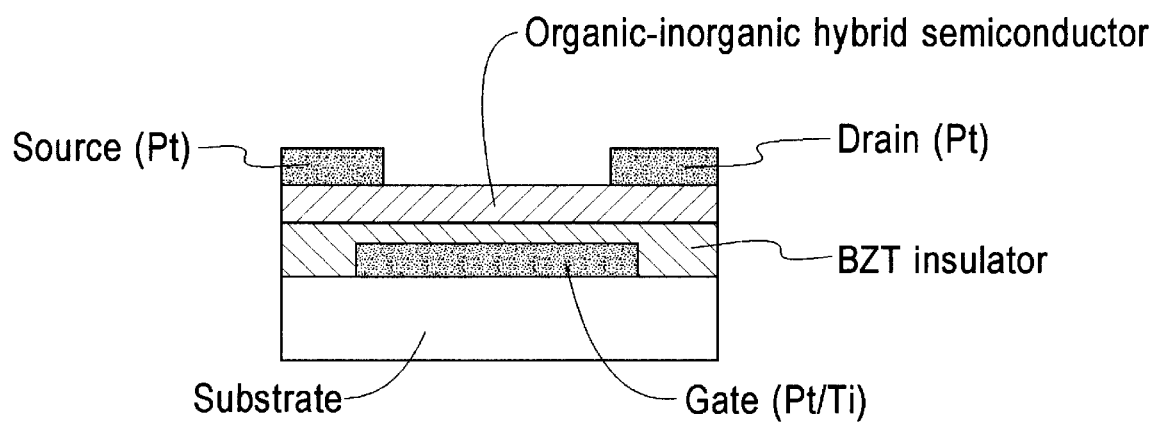
FIG. 6 is a schematic sketch of the organic-inorganic hybrid-based TFT devices with a high dielectric constant gate insulator as proposed in this application.
Figure 6B:
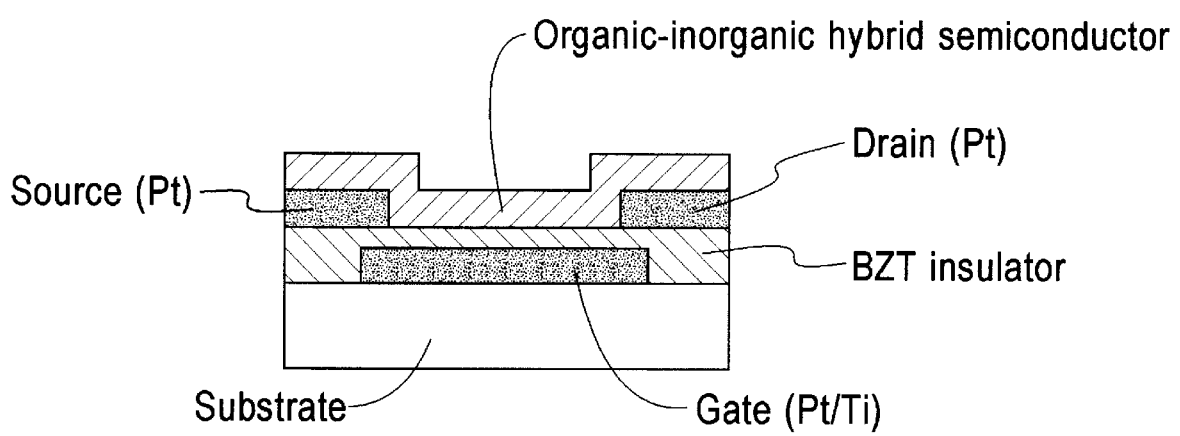

FIG. 3 shows the dependence of $\mu$ on the maximum $V_G$ used at different gate-voltage-sweep experiments while $V_D$ was kept constant at −100 V and $V_S$ was always set to 0 volts. The observed behavior could be attributed to a dependence of mobility on the gate field, E, where $$E = \frac{dV}{dy}$$

and y is the thickness of the insulator, or the accumulated carrier concentration at the semiconductor/insulator interface. Both the gate field and the accumulated carrier concentration at the semiconductor/insulator interface increase linearly with increasing gate voltage or with decreasing insulator thickness. By using a thinner layer of thermally grown SiO$_2$ as gate insulator (150 nm thick), mobility of 0.5 cm$^2$ V$^{-1}$ sec$^{-1}$ and on/off ratio above $10^4$ was achieved for a gate voltage variation from −10 to +10 volts, while keeping the drain voltage at −20 volts. FIGS. 4, 5a and 5b, show the operating characteristics of such a device.

In single crystalline inorganic semiconductors such as silicon, in which the mobility does not increase with increasing gate voltage and hence high gate fields, a thinner gate dielectric layer is typically used to reduce the voltage required to achieve a specific on current and a specific of current. Hence the operating voltage of silicon TFT devices can be reduced by using thinner dielectric layers. However, this method suffers from the limitation that thin dielectrics are more susceptible to failure due to pinhole defects and exhibit lower dielectric breakdown voltages and higher leakage currents than thicker gate dielectrics. These limitations are more pronounced and could present serious problems, in the case of large area applications on substrates such as glass or plastic. Hence reducing the thickness of the gate dielectric is not the best way to harness the gate voltage dependent mobility of organic-inorganic hybrid based TFTs.

Another cause of the gate voltage dependence depicted in FIG. 3 could be the change in accumulated carrier concentration at the semiconductor/insulator interface that results from the change in the applied gate voltage. It is probable, that in organic-inorganic hybrid semiconductor TFT, the accumulation of extra charge carriers facilitates the filling of trap states thereby allowing the additional carriers to move more easily without being hampered by the trapping process. This is the case for organic semiconductor TFTs as shown in the prior art (Dimitrakopoulos et al. U.S. Pat. Nos. 5,981,970 and 5,946,551, and Science Vol. 283, pp. 822–824, (1999)). We propose to facilitate charge accumulation in the organic-inorganic hybrid semiconductor/insulator interface by replacing SiO$_2$ with an insulator that has a similar thickness but a higher dielectric constant. In this case, a similar accumulated carrier concentration is attained as in the SiO$_2$ case, but at lower gate fields and thus gate voltages, with all the other parameters kept the same.

If this hypothesis is correct, a high mobility should be achieved in these devices at lower voltages compared to TFTs using comparable thickness of SiO$_2$. In the opposite case, in other words if the mobility was field dependent but independent of the carrier concentration, a relatively low mobility should be observed at the lower gate voltages used in the case of the latter sample. As will be shown in the following, comparing the measured field effect mobilities from devices based on the two different insulators with comparable thickness but different dielectric constants, supports our hypothesis. The following example details the fabrication of an organic-inorganic hybrid perovskite $((C_6H_5C_2H_4NH_3)_2SnI_4)$ based TFT using a high dielectric constant inorganic film as the gate insulator and the resulting high field effect mobilities at low operating voltages.

EXAMPLE 1

We have fabricated TFTs having as semiconductor the organic-inorganic perovskite $(C_6H_5C_2H_4NH_3)_2SnI_4$ and gate insulator a thin film of barium zirconate titanate (BZT). Oxidized silicon or quartz substrates were cleaned in an isopropanol bath using ultrasonic agitation and dried with nitrogen. They were then assembled with a metal mask with openings corresponding to the gate lines and placed and pumped down to high vacuum in an electron beam evaporator. Gate metallization of a bilayer of 15 nm titanium followed by 30 nm of Pt was deposited on the substrates by electron beam evaporation. The samples were unloaded from the assembly and coated with a layer of BZT. The BZT layer was deposited using RF magnetron sputtering of a sintered powder target of BZT, in an Ar/O2 gas mixture. The substrates were held at room temperature during sputtering and the chamber pressure was approximately $2.5 \times 10^{-3}$ Torr. The power density was 0.8 W cm$^{-2}$. The dielectric constant $\in$ of these BZT films is usually about 17. Pt source and drain electrodes were vapor deposited on top of BZT gate insulator layer through a shadow mask. In order to create devices with channel length (L) of the order of 10 $\mu$m, silicon membrane masks were fabricated and used. The organic-inorganic hybrid perovskite semiconductor $(C_6H_5C_2H_4NH_3)_2SnI_4$ layer was deposited by spin-coating from an anhydrous methanol solution with a concentration of 20 milligram per milliliter. The solution was filtered through a 0.2-$\mu$m polytetrafluoroethylene Whatman syringe filter and spun onto the substrate at 2500 rpm for 2 minutes in an inert atmosphere. The resulting 30 nm thick film was dried at 80° C. for 10 minutes (K. Chondroudis, C. D. Dimitrakopoulos, C. R. Kagan, I. Kymissis, D. B. Mitzi; "Thin Film Field Effect Transistors With Organic-Inorganic Hybrid Materials As Semiconducting Channels"; Ser. No. 09/245,460; Filed on Feb. 5, 1999).

As will be seen shortly, the modest increase in dielectric constant obtained by using these amorphous BZT gate insulator films instead of SiO$_2$ is adequate for the purpose of the organic-inorganic hybrid perovskite semiconductor TFT application. However, the scope of the present invention is not limited to such deposition process only. BZT films and films of most of the previously mentioned high dielectric constant gate insulators can be alternately deposited using other methods. Depending on the specific high dielectric constant gate insulator one or more of the following methods can be applied: deposition from solutions of organometallic precursors of the oxide components (Dimitrakopoulos et al.

U.S. Pat. No. 5,946,551), laser ablation, anodization, CVD deposition and these methods could be used without deviating from the spirit of our invention.

The organic-inorganic hybrid perovskite semiconductor layer can alternatively be deposited using sublimation in vacuum (Mitzi, Prikas and Chondroudis *Chem. Mater.* Vol. 11, 542, (1999)), or dip coating (Liang, Mitzi, and Prikas *Chem. Mater.* Vol. 10, 304, (1998)), stamping, screening, spraying, inkjet printing and other solution processing techniques.

Although high work function metals such as gold, platinum, and palladium are preferred for the fabrication of source and drain electrodes other source drain contact materials such as chromium, titanium, copper, aluminum, molybdenum, tungsten, nickel, conducting polymers, oligomers and organic molecules, can be used without deviating from the spirit of the invention.

Completed TFT samples were then tested electrically in an inert atmosphere using a Hewlett Packard Model 4145A semiconductor parameter analyzer to determine their operating characteristics.

Figure 8:
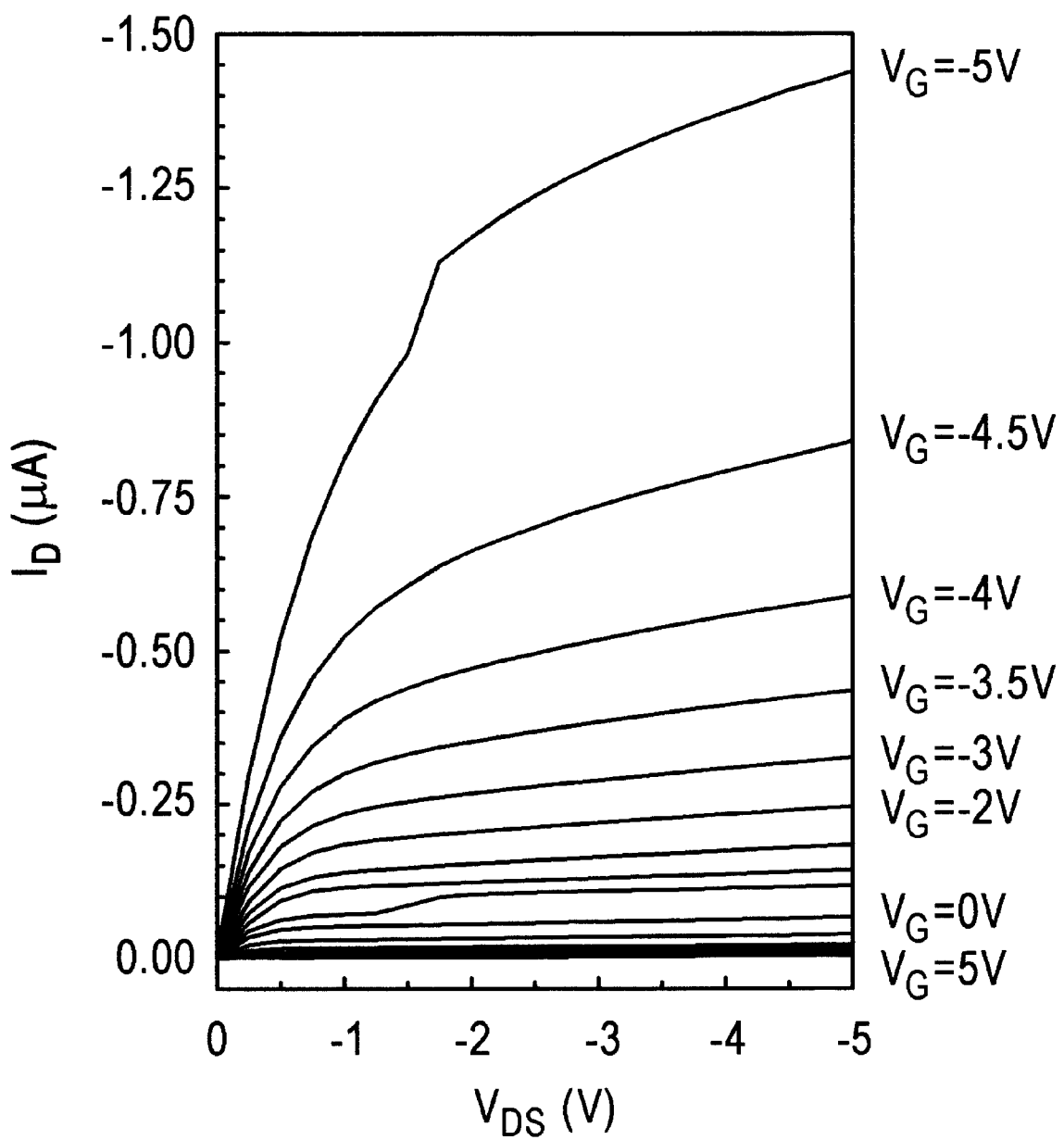
FIG. 8(6) is the measured operating characteristics of a TFT device using the organic-inorganic hybrid perovskite $(C_6H_5C_2H_4NH_3)_2SnI_4$ as semiconductor and an approximately 177.5 nm thick layer of barium zirconate titanate film (deposited by sputtering keeping the substrate at room temperature) as the gate insulator. Dependence of the drain current on the source-drain voltage is shown at different gate voltage levels.

FIG. 7a (left axis) shows the typical device characteristics of an organic-inorganic hybrid perovskite $(C_6H_5C_2H_4NH_3)_2SnI_4$ based TFT, represented by the schematic drawing in FIG. 8(6), in which the thickness of the BZT gate-insulator was approximately 177.5 nm and its dielectric constant, $\in \cong 17$. The BZT gate insulator was deposited by sputtering as described earlier. The source drain separation (channel length, L) was 15.8 $\mu$m and the channel width, W, was 1000 $\mu$m. It show in a semilogarithmic plot the dependence of $I_D$ on $V_G$ in saturation. FIG. 7b (right axis) shows a plot of the square root of $I_D$ vs. $V_G$. The field effect mobility, $\mu$, is calculated from the slope of the $\sqrt{|I_D|}$ vs. $V_G$ plot to be 0.3 cm$^2$ V$_{-1}$ sec$^{-1}$. The current modulation is about $10^5$ for a gate voltage variation of 4 volts.

FIG. 8(6) is the measured operating characteristics of a TFT device using the organic-inorganic hybrid perovskite $(C_6H_5C_2H_4NH_3)_2SnI_4$ as semiconductor and an approximately 177.5 nm thick layer of barium zirconate titanate film (deposited by sputtering while keeping the substrate at room temperature) as the gate insulator. Dependence of the drain current on the source-drain voltage is shown at different gate voltage levels. It shows the dependence of the current flowing between source and drain electrodes ($I_D$) on the voltage applied to the drain electrode ($V_D$), at discrete voltages applied to the gate electrode ($V_G$) for the device described in the previous paragraph.

A remarkably low maximum operating voltage was used in the device of FIGS. 7a, 7b and 8 (up to 4 volts) to achieve mobilities and on-off ratios comparable to ones measured form devices with SiO$_2$ gate insulator of similar thickness, which however required higher operating voltage to produce such mobility and on-off ratio values. It should be noted that the fact that the thickness of the BZT gate insulator in the device corresponding to FIGS. 7a and 7b and 8 is 15% larger than the SiO$_2$ gate insulator in the device corresponding to FIG. 4, 5a and 5b. This means that the operating voltage in the device corresponding to FIG. 7a, 7b and 8 could be 15% lower than 4 V.

Thus, it is clear that high mobilities can be achieved in organic-inorganic hybrid based TFT devices at low voltages when high dielectric constant films are used as gate insulators. This substantiates our hypothesis that the gate voltage dependence in these devices is a result of higher concentration of the charge carriers achieved with these insulators, since the applied gate fields were kept very low.

Exemplary organic-inorganic hybrid semiconductor materials useful to practice the present invention are one or more of the perovskite $(C_6H_5C_2H_4NH_3)_2SnI_4$ of butylammonium methylammonium tin iodide $[(C_4H_9NH_3)_2CH_3NH_3Sn_2I_7]$, phenethylammonium methylammonium tin iodide $[(C_6H_5C_2H_4NH_3)_2CH_3NH_3Sn_2I_7]$, butanediammonium tin iodide $[(H_3NC_4H_8NH_3)SnI_4]$, butylammonium tin iodide, hexylammonium tin iodide, nonylammonium tin iodide, and dodecylammonium tin iodide and derivatives thereof.

What is claimed is:

1. A transistor device structure comprising:
    a substrate on which an electrically conducting gate electrode is disposed;
    a layer of high dielectric constant gate insulator disposed on said gate electrode;
    an electrically conductive source electrode and an electrically conductive drain electrode disposed on said layer of gate insulator;
    a layer of an organic-inorganic hybrid semiconductor disposed on said gate insulator and said source electrode and said drain electrode.

2. A transistor device structure according to claim 1 wherein said gate insulator has a high dielectric constate.

3. A structure according to claim 1 wherein the substrate is selected from the group consisting of glass, plastic, quartz, undoped silicon and heavily doped silicon.

4. A structure according to claim 3 wherein the said plastic substrate is selected from the group comprising polycarbonate, Mylar, polyimide and polyethylene terephthalate.

5. A structure according to claim 1 wherein the said gate electrode material is selected from the group consisting of chromium, titanium, copper, aluminum, molybdenum, tungsten, nickel, gold, platinum, palladium, conducting polyaniline, conducting polypyrrole or combinations thereof.

6. A structure according to claim 1 wherein said gate electrodes are 30 nm to 500 nm thick and are produced by a process selected from the group consisting of evaporation, sputtering, chemical vapor deposition, electrodeposition, spin coating, and electroless plating.

7. A structure according to claim 1 wherein said high dielectric constant insulator is selected from the group barium strontium titanate, barium zirconate titanate, lead zirconate titanate, lead lanthanum titanate, strontium titanate, bismuth titanate, barium magnesium fluoride, tantalum pentoxide, titanium dioxide and yttrium trioxide, aluminum trioxide and silicon nitride.

8. A structure according to claim 7 wherein the said insulator has a thickness in the range of 80 nm to 1000 nm.

9. A structure according to claim 7 wherein the said insulator is produced by a process selected from the group consisting of sputtering, chemical vapor deposition, sol-gel coating, dip-coating, evaporation, laser ablative deposition and anodization.

10. A structure according to claim 7 wherein the high dielectric constant insulator is an organic material.

11. A structure according to claim 1 wherein said organic-inorganic hybrid semiconductor is any organic-inorganic hybrid semiconductor that exhibits an increase in field effect mobility with increasing gate voltage.

12. A structure according to claim 11 wherein said organic-inorganic hybrid semiconductor is the perovskite $(C_6H_5C_2H_4NH_3)_2SnI_4$.

13. A structure according to claim 12 wherein said organic-inorganic hybrid semiconductor is selected from the group consisting of one or more of butylammonium methylammonium tin iodide, phenethylammonium methylammonium tin iodide, butanediammonium tin iodide, butylammonium tin iodide, hexylammonium tin iodide, nonylammonium tin iodide, and dodecylammonium tin iodide and derivatives thereof.

14. A structure according to claim 11 wherein the said organic-inorganic hybrid semiconductor layer has a thickness in the range from two monolayers to 400 nm.

15. A method of fabricating a transistor device structure comprising:
   providing a substrate on which an electrically conducting gate electrode is disposed;
   disposing a layer of high dielectric constant gate insulator disposed on said gate electrode;
   disposing an electrically conductive source electrode and an electrically conductive drain electrode on said layer of gate insulator;
   disposing a layer of an organic-inorganic hybrid semiconductor on said gate insulator and said source electrode and said drain electrode.

16. A method according to claim 15 wherein the said organic-inorganic hybrid semiconductor layer is deposited by a process selected from the group consisting of sublimation, evaporation, molecular beam deposition or a combination thereof.

17. A method according to claim 15 wherein the said organic-inorganic hybrid semiconductor layer is deposited by a solution based process selected from the group consisting of spin coating, dip-coating, self assembly from solution, stamping, screening, spraying, inkjet printing or a combination thereof.

18. A method according to claim 15 wherein the said organic-inorganic hybrid semiconductor layer is optionally segmented by a process selected from the group consisting of deposition through a mask, screen printing, stamping, and lithographic patterning of the blanket film, in order to minimize the leakage and stray currents in the TFT device.

19. A structure according to claim 1 wherein said source and drain electrodes are made of material selected from the group consisting of chromium, titanium, copper, aluminum, molybdenum, tungsten, nickel, gold, palladium, platinum, conducting polymers, oligomers and small organic molecules and combinations thereof.

20. A structure according to claim 19 wherein an optional ohmic contact layer made of a material selected from the group consisting of gold, platinum, palladium, conducting polymers and oligomers, semiconducting polymers and oligomers, and combination thereof, is disposed between said source/drain electrodes and said semiconductor layer.

21. A structure according to claim 19 wherein the thickness of the said source and drain electrodes is in the range 30 nm to 500 nm.

22. A method according to claim 15 wherein said source and drain electrodes are patterned by a method selected from the group consisting of deposition through shadow mask and lithographic patterning techniques.

23. A structure according to claim 2 wherein said passivation layer is a polymer selected from the group consisting of polyimide, parylene and undoped polyaniline.

24. A thin film transistor device structure comprising a substrate on which a plurality of electrically conducting gate electrodes are disposed; a layer of high dielectric constant gate insulator disposed on said electrodes; a layer of an organic-inorganic hybrid semiconductor disposed on said insulator and substantially overlapping with each of the said gate electrodes; a plurality of sets of electrically conductive source and drain electrodes disposed on said organic-inorganic hybrid semiconductor and said high dielectric constant gate insulator in alignment with each of the said gate electrodes.

25. A transistor device structure comprising: a drain, a source electrode, a drain electrode, a gate electrode, a gate insulator and a semiconductive material disposed between and in electrical contact with said source electrode and said gate electrode, said gate insulator is disposed between said gate electrode and said active region; said semiconductive material is an organic-inorganic hybrid material.

26. A transistor device according to claim 25 wherein said organic-inorganic hybrid material is the perovskite $(C_6H_5C_2H_4NH_3)_2SnI_4$.

27. A transistor device according to claim 25 wherein said organic-inorganic hybrid material is selected from the group consisting of one or more of butylammonium methylammonium tin iodide, phenethylammonium methylammonium tin iodide, butanediammonium tin iodide, butylammonium tin iodide, hexylammonium tin iodide, nonylammonium tin iodide, and dodecylammonium tin iodide and derivatives thereof.

28. A transistor device according to claim 1 wherein said organic-inorganic hybrid semiconductor is a perovskite material.

29. A structure according to claim 1 further including an insulating passivation layer disposed on said structure that protects it from further processing exposures and from the external ambient.

30. A structure according to claim 1 wherein said high dielectric constant insulator is a composite layer consisting of high dielectric constant particles contained in a matrix material exhibiting a lower dielectric constant.

31. A structure according to claim 12 wherein said high dielectric constant insulator is a composite layer consisting of high dielectric constant particles contained in a matrix material exhibiting a lower dielectric constant.

32. A structure according to claim 13 wherein said organic-inorganic hybrid semiconductor is any organic-inorganic hybrid semiconductor that exhibits an increase in field effect mobility with increasing gate voltage.

33. A structure according to claim 24 wherein said high dielectric constant insulator is a composite layer consisting of high dielectric constant particles contained in a matrix material exhibiting a lower dielectric constant.

34. A structure according to claim 25 wherein said organic-inorganic hybrid semiconductor is any organic-inorganic hybrid semiconductor that exhibits an increase in field effect mobility with increasing gate voltage.

35. A method according to claim 25 wherein said high dielectric constant insulator is a composite layer consisting of high dielectric constant particles contained in a matrix material exhibiting a lower dielectric constant.

36. A method according to claim 25 wherein said organic-inorganic hybrid semiconductor is any organic-inorganic hybrid semiconductor that exhibits an increase in field effect mobility with increasing gate voltage.

37. A method according to claim 15 wherein said organic-inorganic hybrid semiconductor is the perovskite $(C_6H_5C_2H_4NH_3)_2SnI_4$.

38. A method according to claim 15 wherein said organic-inorganic hybrid semiconductor is selected from the group consisting of one or more of butylammonium methylammonium tin iodide, phenethylammonium methylammonium tin iodide, butanediammonium tin iodide, butylammonium tin iodide, hexylammonium tin iodide, nonylammonium tin iodide, and dodecylammonium tin iodide and derivatives thereof.

39. A method according to claim 37 wherein said high dielectric constant insulator is a composite layer consisting of high dielectric constant particles contained in a matrix material exhibiting a lower dielectric constant.

40. A method according to claim 37 wherein said organic-inorganic hybrid semiconductor is any organic-inorganic hybrid semiconductor that exhibits an increase in field effect mobility with increasing gate voltage.

41. A method according to claim 38 wherein said high dielectric constant insulator is a composite layer consisting of high dielectric constant particles contained in a matrix material exhibiting a lower dielectric constant.

42. A method according to claim 38 wherein said organic-inorganic hybrid semiconductor is any organic-inorganic hybrid semiconductor that exhibits an increase in field effect mobility with increasing gate voltage.

* * * * *